United States Patent
Choi et al.

(10) Patent No.: US 12,188,755 B2
(45) Date of Patent: Jan. 7, 2025

(54) DEVICE AND METHOD THEREOF FOR OPERATING ELECTRONIC DETONATOR HAVING AUXILIARY POWER FUNCTION

(71) Applicant: HANWHA CORPORATION, Seoul (KR)

(72) Inventors: Jeong Ho Choi, Cheongju-si (KR); Se Ho Kim, Cheongju-si (KR)

(73) Assignee: HANWHA CORPORATION, Seoul (KR)

(*) Notice: Subject to any disclaimer, the term of this patent is extended or adjusted under 35 U.S.C. 154(b) by 0 days.

(21) Appl. No.: 18/008,716

(22) PCT Filed: Oct. 7, 2022

(86) PCT No.: PCT/KR2022/015132
§ 371 (c)(1),
(2) Date: Dec. 7, 2022

(87) PCT Pub. No.: WO2023/128158
PCT Pub. Date: Jul. 6, 2023

(65) Prior Publication Data
US 2024/0230300 A1 Jul. 11, 2024

(30) Foreign Application Priority Data
Dec. 29, 2021 (KR) .................. 10-2021-0190498

(51) Int. Cl.
*F42D 1/05* (2006.01)
*F42C 11/00* (2006.01)
(Continued)

(52) U.S. Cl.
CPC .............. *F42D 1/05* (2013.01); *F42C 11/001* (2013.01); *F42C 19/12* (2013.01); *G01R 31/40* (2013.01); *H02J 7/34* (2013.01); *H02J 2207/50* (2020.01)

(58) Field of Classification Search
CPC .. F42B 3/10; F42C 19/08; F42C 19/12; F42C 11/001; H02J 7/34; H02J 2207/50;
(Continued)

(56) References Cited

U.S. PATENT DOCUMENTS

2019/0391607 A1* 12/2019 Chen .................. H02J 9/061

FOREIGN PATENT DOCUMENTS

| JP | 2004-36984 A | 2/2004 |
| JP | 2004036984 A * | 2/2004 |

(Continued)

OTHER PUBLICATIONS

Machine translation of Kang et al. Korean Patent Document KR 1016538 B1 Feb. 2011 (Year: 2011).*
(Continued)

*Primary Examiner* — Kevin J Comber
(74) *Attorney, Agent, or Firm* — WHDA, LLP

(57) ABSTRACT

A device and a method thereof for operating an electronic detonator having an auxiliary power function are proposed. The device is configured to include a power supply unit configured to supply power to a power source unit of the detonation capacitor and a power source unit of the operation capacitor, a power state determination unit configured to determine a state of the power charged in the power source unit of the operation capacitor, and an auxiliary power supply request unit configured to request auxiliary power supply to the power source unit of the detonation capacitor when the determined state of the power charged in the power source unit of the operation capacitor falls within a preset abnormal power state range.

6 Claims, 2 Drawing Sheets

(51) Int. Cl.
*F42C 19/12* (2006.01)
*G01R 31/40* (2020.01)
*H02J 7/34* (2006.01)

(58) Field of Classification Search
CPC . G01R 31/40; F42D 1/045; F42D 1/05; F42D 3/04
USPC .......................................................... 361/248
See application file for complete search history.

(56) References Cited

FOREIGN PATENT DOCUMENTS

| | | | | |
|---|---|---|---|---|
| JP | 202-159588 | A | 10/2020 | |
| JP | 2020-159588 | A | 10/2020 | |
| JP | 6975345 | B2 | 11/2021 | |
| KR | 1016538 | B1 * | 2/2011 | ............ F42C 11/065 |

OTHER PUBLICATIONS

Machine translation of Kuroki et al. Japanese Patent Document JP 2004-036984 A Feb. 2004 (Year: 2004).*

* cited by examiner

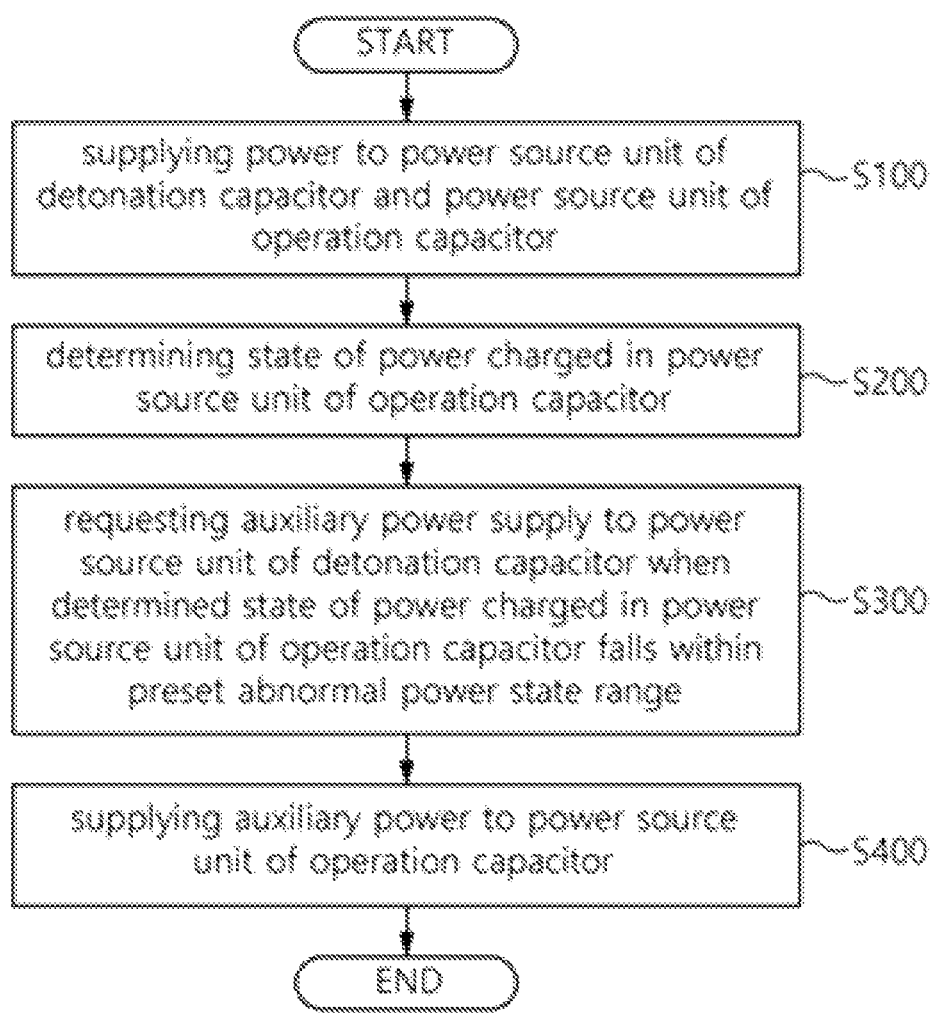

DEVICE AND METHOD THEREOF FOR OPERATING ELECTRONIC DETONATOR HAVING AUXILIARY POWER FUNCTION

TECHNICAL FIELD

The present disclosure relates to a device and a method thereof for operating an electronic detonator having an auxiliary power function and, more particularly, to a device and a method thereof for operating an electronic detonator having an auxiliary power function, wherein, among a detonation capacitor and an operation capacitor, which are included in the electronic detonator and separated into two respective power sources, when operation power of the operation capacitor is lost, auxiliary power held by the detonation capacitor is supplied to the operation capacitor.

BACKGROUND ART

In general, a component having the largest mass and size in an electronic detonator is a power supply capacitor. Accordingly, during blasting, there is a possibility that the capacitor will be damaged by a shock transmitted through a medium when an adjacent blast is detonated.

When such damage occurs, the electronic detonator loses a function that the corresponding capacitor is responsible for.

For example, in a case of an electronic detonator composed of a single capacitor, since charged energy is responsible for both of the operation power during a blasting count and the detonation energy for detonating a gunpowder unit after the blasting count is finished, all functions are lost.

In addition, in another case of an electronic detonator composed of two capacitors and configured to separate a circuit operation function and a detonation energy storage function from each other, when a specific capacitor is damaged, the damage leads to the loss of corresponding functions. In particular, when the operation power is lost, the electronic detonator lose its control, whereby a detonation function is lost as well, and thus when the detonation power is lost, the detonation function is lost.

Therefore, the capacitor damage instantly leads to generating undetonated residual gunpowder due to the loss of the electronic detonator function, thereby becoming a risk factor in subsequent clean-up work.

In this regard, Korean Patent No. 1336424 discloses "DETONATOR CIRCUIT OF ELECTRONIC DETONATOR".

DISCLOSURE

Technical Problem

The present disclosure is devised to solve the above described problems, and an objective of the present disclosure is to provide a device and a method thereof for operating an electronic detonator having an auxiliary power function, wherein a state of power charged in a power source unit of an operation capacitor is determined when blasting is started after power charging of a power source unit of a detonation capacitor and the power source unit of the operation capacitor is completed.

In addition, another objective of the present disclosure is to provide a device and a method thereof for operating an electronic detonator having an auxiliary power function, wherein supply of auxiliary power to a power source unit of a detonation capacitor is requested when a state of power charged in a power source unit of an operation capacitor falls within a preset abnormal power state range.

Technical Solution

According to the present disclosure for achieving the above objectives, there is provided a device for operating an electronic detonator having an auxiliary power function, the device operating the electronic detonator configured to include a detonation capacitor and an operation capacitor, which are separated by two respective power sources, and including: a power supply unit configured to supply power to a power source unit of the detonation capacitor and a power source unit of the operation capacitor; a power state determination unit configured to determine a state of the power charged in the power source unit of the operation capacitor; and an auxiliary power supply request unit configured to request auxiliary power supply to the power source unit of the detonation capacitor when the determined state of the power charged in the power source unit of the operation capacitor falls within a preset abnormal power state range.

In addition, a circuit structure may be configured to include a path through which the power of the power source unit of the detonation capacitor is supplied to the power source unit of the operation capacitor.

In addition, the power state determination unit may determine the state of the power charged in the power source unit of the operation capacitor when blasting is started after power charging of the power source unit of the detonation capacitor and the power source unit of the operation capacitor is completed.

In addition, the auxiliary power supply request unit may make the auxiliary power charged in the power source unit of the detonation capacitor to be supplied to the power source unit of the operation capacitor when the state of the power charged in the power source unit of the operation capacitor is less than or equal to preset power or is lost and falls within the abnormal power state range.

According to the present disclosure for achieving the above objectives, there is provided a method for operating an electronic detonator having an auxiliary power function, the method operating the electronic detonator configured to include a detonation capacitor and an operation capacitor, which are separated by two respective power sources, and including: supplying, by a power supply unit, power to a power source unit of the detonation capacitor and a power source unit of the operation capacitor; determining, by a power state determination unit, a state of the power charged in the power source unit of the operation capacitor; and requesting, by an auxiliary power supply request unit, auxiliary power supply to the power source unit of the detonation capacitor when the determined state of the power charged in the power source unit of the operation capacitor falls within a preset abnormal power state range.

In addition, in the determining of the state of the power charged in the power source unit of the operation capacitor, the state of the power charged in the power source unit of the operation capacitor may be determined when blasting is started after power charging of the power source unit of the detonation capacitor and the power source unit of the operation capacitor is completed.

In addition, in the requesting of the auxiliary power supply to the power source unit of the detonation capacitor when the determined state of the power charged in the power source unit of the operation capacitor falls within the preset abnormal power state range, the auxiliary power charged in the power source unit of the detonation capacitor may be made to be supplied to the power source unit of the operation capacitor when the state of the power charged in the power source unit of the operation capacitor is less than or equal to preset power or is lost and falls within the abnormal power state range.

Advantageous Effects

The present disclosure relates to the device and the method thereof for operating the electronic detonator having the auxiliary power function, and the state of the power charged in the power source unit of the operation capacitor is by determined when the blasting is started after the power charging of the power source unit of the detonation capacitor and the power source unit of the operation capacitor is completed, and the auxiliary power supply to the power source unit of the detonation capacitor is requested and received when the determined state of the power charged in the power source unit of the operation capacitor falls within the preset abnormal power state range, whereby there is an effect that the loss of the electron detonator function may be prevented from occurring.

In this way, the present disclosure may increase the resistance of the electronic detonator against excessive shock generated by causes such as large blast holes or defective perforation quality, and may reduce the likelihood of occurrences of safety problems that may be caused when non-detonation occurs due to the function loss.

DESCRIPTION OF DRAWINGS

FIG. 2 is a flowchart illustrating a sequence of a method of operating an electronic detonator having an auxiliary power function according to the present disclosure.

BEST MODE

Figure 1:
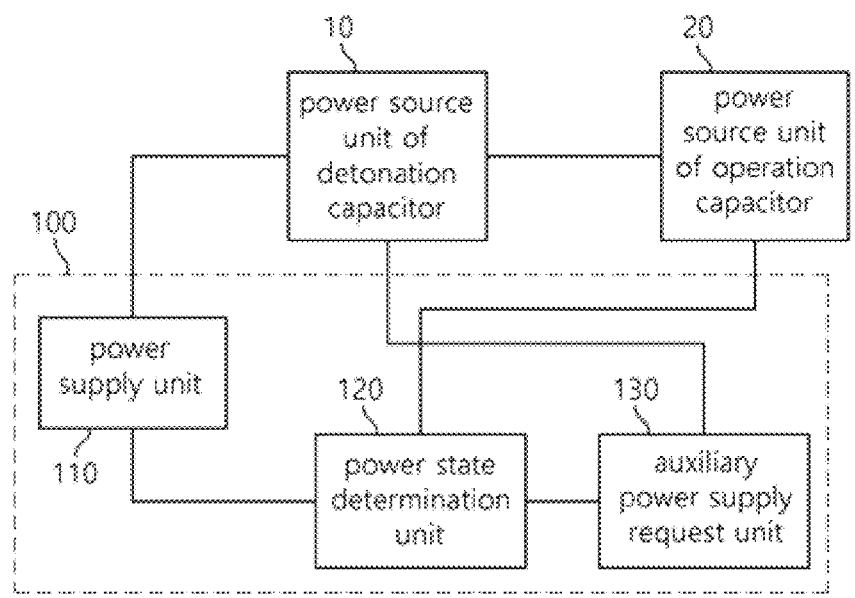
FIG. 1 is a view illustrating a configuration of a device for operating an electronic detonator having an auxiliary power function according to the present disclosure.

In the present disclosure, various modifications may be made and various exemplary embodiments may be provided, and specific exemplary embodiments will be illustrated in the drawings and described in detail.

However, this is not intended to limit the present disclosure to a particular disclosed form. On the contrary, the present disclosure is to be understood to include all various alternatives, equivalents, and substitutes that may be included within the idea and technical scope of the present disclosure. While describing each drawing, similar reference numerals have been used for similar components.

When a component is described as being "connected", "coupled", or "linked" to another component, that component may be directly connected, coupled, or linked to that other component. However, it should be understood that yet another component between each of the components may be present. In contrast, it should be understood that when a component is referred to as being "directly coupled" or "directly connected" to another component, there are no intervening components present.

The terminology used herein is for the purpose of describing particular exemplary embodiments only and is not intended to be limiting. As used herein, the singular forms are intended to include the plural forms as well, unless the context clearly indicates otherwise. In addition, it will be further understood that the terms "comprise", "include", "have", etc. when used in the present application, specify the presence of stated features, integers, steps, operations, elements, components, and/or combinations of them but do not preclude the possibility of the presence or addition of one or more other features, integers, steps, operations, elements, components, and/or combinations thereof.

Hereinafter, preferred exemplary embodiments of the present disclosure will be described in more detail with reference to the accompanying drawings. Hereinafter, the same reference numerals are used for the same components in the drawings, and duplicate descriptions for the same components are omitted.

FIG. 1 is a view illustrating a configuration of a device for operating an electronic detonator having an auxiliary power function according to the present disclosure.

Describing with reference to FIG. 1, the device 100 for operating the electronic detonator having the auxiliary power function according to the present disclosure largely includes a power supply unit 110, a power state determination unit 120, and an auxiliary power supply request unit 130. Here, the device 100 for operating the electronic detonator having the auxiliary power function according to the present disclosure is included in and operated by the electronic detonator including a detonation capacitor and an operation capacitor, which are separated by two respective power sources. In addition, the electronic detonator according to the present disclosure is configured to have a circuit structure including a path in which power of a power source unit 10 of the detonation capacitor is supplied to a power source unit 20 of the operation capacitor.

The power supply unit 110 supplies power to the power source unit 10 of the detonation capacitor and the power source unit 20 of the operation capacitor.

The power supply unit 110 causes the power to be supplied to the power source unit 10 of the detonation capacitor and the power source unit 20 of the operation capacitor at the same time, thereby preventing a period of time when no power is supplied in a case where the operation capacitor is damaged in the future.

The power supply unit 110 as described above does not supply power to the power source unit 10 of the detonation capacitor and the power source unit 20 of the operation capacitor when blasting is started. That is, the power supply unit 110 supplies the power to the power source unit 10 of the detonation capacitor and the power source unit 20 of the operation capacitor until the blasting starts, so as to allow power charging to be performed.

The power state determination unit 120 determines a state of power charged in the power source unit 20 of the operation capacitor.

The power state determination unit 120 may determine the state of the power charged in the power source unit 20 of the operation capacitor when blasting is started after the power charging of the power source unit 10 of the detonation capacitor and the power source unit 20 of the operation capacitor is completed.

The auxiliary power supply request unit 130 requests auxiliary power supply to the power source unit 10 of the detonation capacitor when the determined state of the power charged in the power source unit 20 of the operation capacitor falls within a preset abnormal power state range.

The auxiliary power supply request unit 130 allows the power source unit 10 of the detonation capacitor to supply the auxiliary power charged therein to the power source unit 20 of the operation capacitor when the state of the power charged in the power source unit 20 of the operation capacitor is less than or equal to preset power or is lost and falls within the abnormal power state range.

That is, when the operation capacitor is damaged by a blasting shock, the auxiliary power supply request unit 130 may supply the power charged in the power source unit 10 of the detonation capacitor to the power source unit 20 of the operation capacitor through the path included in the circuit structure, so as to prevent the loss of the electronic detonator function.

FIG. 2 is a flowchart illustrating a sequence of a method of operating an electronic detonator having an auxiliary power function according to the present disclosure.

Describing with reference to FIG. 2, the method of operating the electronic detonator having the auxiliary power function according to the present disclosure uses the device for operating the electronic detonator having the auxiliary power function according to the present disclosure described above, and hereinafter, the duplicate description will be omitted.

First, in step S100, power is supplied to a power source unit of a detonation capacitor and a power source unit of an operation capacitor.

In step S100, the power is supplied to the power source unit of the detonation capacitor and the power source unit of the operation capacitor at the same time, so that no power supply period is prevented from occurring when the operation capacitor is damaged in the future, and the power supply is performed until blasting starts.

Next, in step S200, a state of power charged in the power source unit of the operation capacitor is determined.

In step S200, when the blasting is started after the power charging of the power source unit of the detonation capacitor and the power source unit of the operation capacitor is completed, the state of the power charged in the power source unit 20 of the operation capacitor may be determined.

Next, in steps S300 and S400, when the state of the power charged in the power source unit of the operation capacitor falls within a preset abnormal power state range, auxiliary power supply is requested to the power supply unit of the detonation capacitor, so as to supply the auxiliary power to the power source unit of the operation capacitor.

In steps S300 and S400, when the state of the power charged in the power source unit of the operation capacitor is less than or equal to the preset power or is lost and falls within the abnormal power state range, the auxiliary power charged in the power source unit of the detonation capacitor is supplied to the power source unit of the operation capacitor.

That is, in steps S300 and S400, when the operation capacitor is damaged by a blasting shock, the power charged in the power source unit of the detonation capacitor is supplied to the power source unit of the operation capacitor through the path included in the circuit structure, thereby preventing leading to the loss of the electronic detonator function.

As described above, the functional operation and the embodiments related to the present subject matter, which are described in the present specification, may be implemented in a digital electronic circuit or computer software, firmware, hardware, or a combination of one or more thereof, including the structures and structural equivalents thereof, which are disclosed herein.

The embodiments of the subject matter described herein may be implemented as one or more computer program products, i.e., one or more modules related to computer program instructions encoded on a tangible program medium for execution by or for controlling the operation of a data processing device. The tangible program medium may be a radio wave signal or a computer-readable medium. The radio wave signal is a signal generated to encode information for transmission to an appropriate receiver device for execution by a computer, that is, for example, an artificially generated signal such as a machine-generated electrical, optical, or electromagnetic signal. The computer-readable medium may be a machine-readable storage device, a machine-readable storage substrate, a memory device, a combination of materials that affect a machine-readable radio wave signal, or a combination of one or more thereof.

Additionally, the logic flows and structural block diagrams described in the present patent document are intended to describe corresponding functions supported by the disclosed structural means and corresponding actions and/or specific methods supported by the disclosed steps, and may also be used to implement corresponding software structures and algorithms and their equivalents.

The present description presents the best mode of the present disclosure, and provides examples for describing the present disclosure and for enabling those skilled in the art to make and use the present disclosure. The specification written in this way is not intended to limit the present disclosure to the specific terms presented.

Accordingly, although the present disclosure has been described in detail with reference to the above-described examples, those skilled in the art can make modifications, changes, and deformation to the present examples without departing from the scope of the present disclosure. In short, in order to achieve the intended effect of the present disclosure, it is not necessary to separately include all the functional blocks shown in the drawings or follow all the orders shown in the drawings. It should be noted that even though all the functional blocks are separately included or all the orders shown in the drawings are followed as they are shown, the corresponding functional blocks and orders may fall within the technical scope of the present invention described in the claims.

The invention claimed is:

1. A device for operating an electronic detonator having an auxiliary power function, the device operating the electronic detonator configured to include a detonation capacitor and an operation capacitor, which are separated by two respective power sources, and comprising:
   a power supply unit configured to supply power to a power source unit of the detonation capacitor and a power source unit of the operation capacitor;
   a power state determination unit configured to determine a state of the power charged in the power source unit of the operation capacitor; and
   an auxiliary power supply request unit configured to request auxiliary power supply [to] from the power source unit of the detonation capacitor when the determined state of the power charged in the power source unit of the operation capacitor falls within a preset abnormal power state range,
   wherein a circuit structure is configured to comprise a path through which the power of the power source unit of the detonation capacitor is supplied to the power source unit of the operation capacitor, and
   wherein the auxiliary power supply request unit supplies the power charged in the power source unit of the detonation capacitor to the power source unit of the operation capacitor through the path included in the circuit structure when the state of the power charged in the power source unit of the operation capacitor is less than or equal to preset power or is lost and falls within the abnormal power state range, so as to prevent the loss of the electronic detonator function.

2. The device of claim 1, wherein the power state determination unit determines the state of the power charged in the power source unit of the operation capacitor when blasting is started after power charging of the power source unit of the detonation capacitor and the power source unit of the operation capacitor is completed.

3. The device of claim 1, wherein the auxiliary power supply request unit makes the auxiliary power charged in the power source unit of the detonation capacitor to be supplied to the power source unit of the operation capacitor when the operation capacitor is damaged by a blasting shock.

4. A method for operating an electronic detonator having an auxiliary power function, the method operating the electronic detonator configured to include a detonation capacitor and an operation capacitor, which are separated by two respective power sources, and comprising:
supplying, by a power supply unit, power to a power source unit of the detonation capacitor and a power source unit of the operation capacitor;
determining, by a power state determination unit, a state of the power charged in the power source unit of the operation capacitor; and
requesting, by an auxiliary power supply request unit, auxiliary power supply from the power source unit of the detonation capacitor when the determined state of the power charged in the power source unit of the operation capacitor falls within a preset abnormal power state range, further comprising:
when the state of the power charged in the power source unit of the operation capacitor is less than or equal to preset power or is lost and falls within the abnormal power state range, by the step of requesting, by the auxiliary power supply request unit, auxiliary power supply to the power source unit of the detonation capacitor,
the power charged in the power source unit of the detonation capacitor is supplied to the power source unit of the operation capacitor through the path included in the circuit structure, so as to prevent the loss of the electronic detonator function.

5. The method of claim 4, wherein, in the determining of the state of the power charged in the power source unit of the operation capacitor, the state of the power charged in the power source unit of the operation capacitor is determined when blasting is started after power charging of the power source unit of the detonation capacitor and the power source unit of the operation capacitor is completed.

6. The method of claim 4, wherein, in the requesting of the auxiliary power supply to the power source unit of the detonation capacitor when the determined state of the power charged in the power source unit of the operation capacitor falls within the preset abnormal power state range, the auxiliary power charged in the power source unit of the detonation capacitor is made to be supplied to the power source unit of the operation capacitor when the operation capacitor is damaged by a blasting shock.

* * * * *